(12) United States Patent
Sensale Rodriguez et al.

(10) Patent No.: US 11,563,078 B2
(45) Date of Patent: Jan. 24, 2023

(54) ULTRA-COMPACT INDUCTOR MADE OF 3D DIRAC SEMIMETAL

(71) Applicant: UNIVERSITY OF UTAH RESEARCH FOUNDATION, Salt Lake City, UT (US)

(72) Inventors: Berardi Sensale Rodriguez, Salt Lake City, UT (US); Ashish Chanana, Salt Lake City, UT (US); Steven M Blair, Salt Lake City, UT (US); Vikram Deshpande, Salt Lake City, UT (US); Michael A Scarpulla, Salt Lake City, UT (US); Hugo Orlando Condori, Salt Lake City, UT (US); Jeffrey Walling, Salt Lake City, UT (US)

(73) Assignee: THE UNIVERSITY OF UTAH RESEARCH FOUNDATION, Salt Lake City, UT (US)

( * ) Notice: Subject to any disclaimer, the term of this patent is extended or adjusted under 35 U.S.C. 154(b) by 404 days.

(21) Appl. No.: 16/817,077

(22) Filed: Mar. 12, 2020

(65) Prior Publication Data
US 2021/0288136 A1 Sep. 16, 2021

(51) Int. Cl.
*H01L 49/02* (2006.01)
*H01L 21/3205* (2006.01)
(Continued)

(52) U.S. Cl.
CPC ........ *H01L 28/10* (2013.01); *H01L 21/02118* (2013.01); *H01L 21/31058* (2013.01); *H01L 21/32055* (2013.01)

(58) Field of Classification Search
CPC .............. H01L 28/10; H01L 21/02118; H01L 21/31058; H01L 21/32055; H01L 21/0272
(Continued)

(56) References Cited

U.S. PATENT DOCUMENTS 9,837,483 B2 12/2017 Gilbert et al.
10,657,456 B1 * 5/2020 Kharzeev ................ H01F 38/14

FOREIGN PATENT DOCUMENTS

CN 105490146 B 1/2019
WO 2019/084609 A1 5/2019

OTHER PUBLICATIONS

"Cadmium Arsenide (Cd3As2)", Polycrystals, Materials safety data sheet, Crystal pieces, Aug. 29, 1 Page.
(Continued)

*Primary Examiner* — David Vu
*Assistant Examiner* — Brandon C Fox
(74) *Attorney, Agent, or Firm* — Workman Nydegger

(57) ABSTRACT

Ultra-compact inductor devices for use in integrated circuits (e.g., RF ICs) that use 3-dimensional Dirac materials for providing the inductor. Whereas inductors currently require significant real estate on an integrated circuit, because they require use of an electrically conductive winding around an insulative core, or such metal deposited in a spiral geometry, the present devices can be far more compact, occupying significantly less space on an integrated circuit. For example, an ultra-compact inductor that could be included in an integrated circuit may include a 3-dimensional Dirac material formed into a geometric shape capable of inductance (e.g., as simple as a stripe or series of stripes of such material), deposited on a substantially non-conductive (i.e., insulative) substrate, on which the Dirac material in the selected geometric shape is positioned. Low temperature manufacturing methods compatible with CMOS manufacturing are also provided.

20 Claims, 12 Drawing Sheets

(51) Int. Cl.
*H01L 21/3105* (2006.01)
*H01L 21/02* (2006.01)

(58) Field of Classification Search
USPC .......................................................... 257/531
See application file for complete search history.

(56) References Cited

OTHER PUBLICATIONS

Chanana et al., "Strong terahertz plasmonic resonances in thin-film Cd3As2: a three-dimensional Dirac semimetal", 2018, 43rd International Conference on Infrared, Millimeter, and Terahertz Waves, 1 Page.

Cheng et al., "Thickness-dependent quantum oscillations in Cd3As2 thin films", New J. Phys. 18 (2016) 083003, 10 Pages.

Liu et al., "Gate-tunable quantum oscillations in ambipolar Cd3As2 thin films," NPG Asia Materials, vol. 7, e221, p. 8 (2015).

Niepce et al., "High Kinetic Inductance NbN Nanowire Superinductors", Phys Rev Applied 11, 044014, Apr. 4, 2019, 12 Pages.

Ooi et al., "Nonlinear plasmonics of three-dimensional Dirac semimetals", APL Photonics: vol. 4, No. 3, 2018, p. 034402-1-034402-7.

Sankar et al., "Large single crystal growth, transport property and spectroscopic characterizations of three-dimensional Dirac semimetal Cd3As2", Scientific Reports vol. 5, Article No. 12966 (2015), 10 Pages.

Sensale-Rodriguez, "Spectrally narrow terahertz plasmonic resonances in three dimensional Dirac semimetals (Conference Presentation)", Proceedings vol. 10917, Terahertz, RF, Millimeter, and Submillimeter-Wave Technology and Applications XII, 2019, 3 Pages.

Shoron et al., "Field-effect transistors with the three-dimensional Dirac semimetal cadmium arsenide: Applied Physics Letters", vol. 115, No. 6, 2019, 10 Pages.

Su et al., "Enhanced Confinement of Terahertz Surface Plasmon Polaritons in Bulk Dirac Semimetal-Insulator-Metal Waveguides", Nanoscale Research Letters, vol. 13, Article No. 308 (2018), 17 Pages.

Suehle et al., "Tin Oxide Gas Sensor Fabricated Using CMOS Micro-Hotplates and In-Situ Processing", IEEE Electron Device Letters, vol. 14, No. 3, Mar. 1993, pp. 118-120.

Wang et al., "Electron Transport in Dirac and Weyl Semimetals", 2018 Chinese Phys. B 27 107402, 44 Pages.

Wang et al., "Tunable terahertz metamaterial absorber based on Dirac semimetal films", Applied Optics, vol. 57, Issue 32, pp. 9555-9561 (2018).

Yue et al., "Semimetal-semiconductor transition and giant linear magnetoresistances in three-dimensional Dirac semimetal Bi0.96Sb0.04 single crystals", Sep. 2015, Applied Physics Letters 107(11), 4 Pages.

Zhao et al., "Tunable multiple plasmon-induced transparency in a simple terahertz Dirac semimetal based metamaterial", vol. 9, No. 8, Aug. 2019, Optical Materials Express 3325-3332.

\* cited by examiner

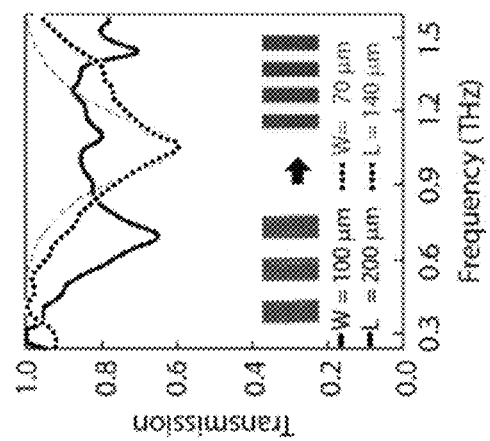
FIG. 6C
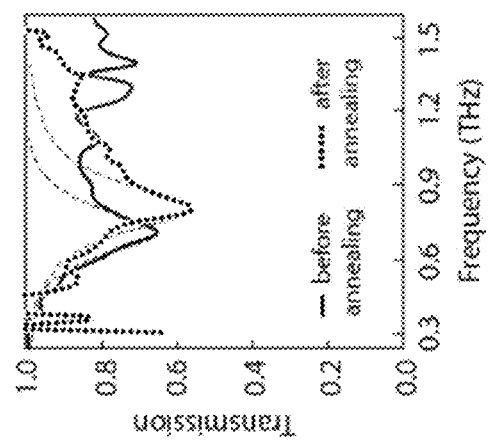
FIG. 6B
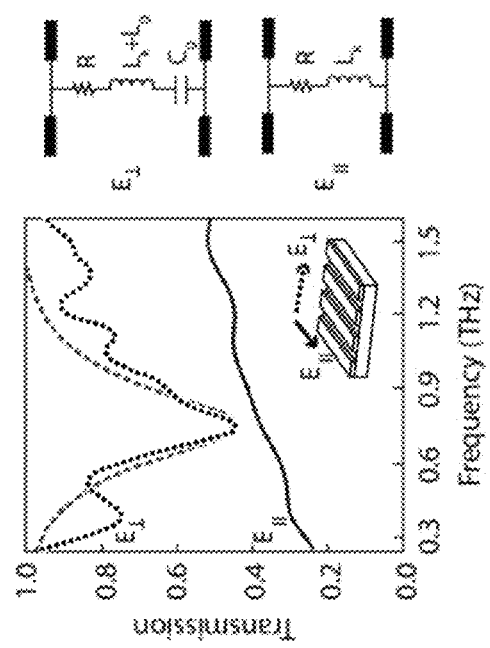
FIG. 6AA
FIG. 6A

ULTRA-COMPACT INDUCTOR MADE OF 3D DIRAC SEMIMETAL

STATEMENT REGARDING FEDERALLY SPONSORED RESEARCH OR DEVELOPMENT

This invention was made with government support under grant no. 1351389 awarded by the National Science Foundation. The government has certain rights in the invention.

BACKGROUND

1. The Field of the Invention

The present invention is in the field of ultra-compact inductors, e.g., for integrated circuits, formed from 3-dimensional Dirac materials.

2. The Relevant Technology

Conventional inductors are circuit components (e.g., a passive component) that converts an input such as electrical current into a magnetic field. Inductors are widely used in construction of various filtering and voltage regulation devices.

Typical integrated circuits are generally formed using planar fabrication processes, making it difficult to integrate compact inductors into such circuits. Where an inductor is included in a given circuit, they occupy an inordinate fraction of the available space on such a circuit, because inductors typically are formed as a coil winding around a core, or analogous structure, which occupies significant space.

While some newer designs rely on use of spiraled conductive metallic wire traces to achieve an inductor structure, such configurations still consume a large fraction of the available space in a circuit, making it difficult to further miniaturize the inductor structure. Problems with miniaturization of the inductor structure inhibit the ability to include inductors, particularly those that would be capable of relatively high inductance, on integrated circuits. For example, an inductor may occupy 60% or more of the area in an RF integrated circuit fabricated using conventional techniques.

While very recent proposals have suggested using multiple transferred layers of a 2-dimensional graphene material to create an inductor from a Dirac material (rather than using conventional copper or similar conductive metal materials), such proposals are not particularly compatible with existing CMOS and similar circuit fabrication techniques. Furthermore, it is questionable whether a 2-dimensional Dirac material such as graphene could provide acceptable performance characteristics.

As such, there continues to be a need for alternative approaches that could provide a route for miniaturized inductor manufacture, that would be suitable for use with conventional, existing integrated circuit manufacturing processes. The subject matter claimed herein is not limited to embodiments that solve any particular disadvantages or that operate only in environments such as those described above. Rather, this background is only provided to illustrate one exemplary technology area where some embodiments described herein may be practiced.

BRIEF SUMMARY

The present invention is directed to the use of 3-dimensional Dirac materials in constructing inductor devices. Whereas inductors currently require significant real estate on an integrated circuit, because they require use of an electrically conductive winding around an insulative core (or an analogous structure), the present devices would require far less surface area on an integrated circuit. For example, an ultra-compact inductor that could be included in an integrated circuit may include a 3-dimensional Dirac material formed into a geometric shape capable of inductance (e.g., as simple as a stripe or dot of such material), deposited on a substantially non-conductive (i.e., insulative) substrate, on which the Dirac material in the selected geometric shape is positioned.

As mentioned, this structure may be as simple as a stripe or on a quartz or other silicon containing, or other substantially non-conductive, insulative substrate. The 3D-Dirac material is positioned on the substrate, in the particular pattern or shape selected (e.g., not limited to stripes, but could also a ring, a dot, etc.). The structure is capable of exhibiting plasmonic resonance, which arise from the large imaginary part of complex conductivity of such materials. As a result, such structures are capable of serving as an inductor in an integrated circuit.

In an embodiment, the 3-dimensional Dirac material may comprise a semimetal, such As, B, Si, Ge, Sb, Te, Po, At, or Bi. In an embodiment, the 3-dimensional Dirac material may include As. Such 3D Dirac semimetals (3D-DSMs) are typically present with or paired with another element (e.g., as a compound including the semimetal). The paired element is often a transition metal (e.g., Cd, Nb, Ta, Mo, Zr), an alkali metal (e.g., Na), or an alkaline earth metal (e.g., Sr). More than 2 elements may be present. An example of a suitable material is $Cd_3As_2$. Other 3D-DSM materials that may also be suitable for use in 3-dimensional form include $SrSi_2$, $Na_3Bi$, $NbAs$, $ZrTe_5$, $MoTe_2$, or $TaAs$. Combinations of materials may also be used.

While stripes or dots of such a $Cd_3As_2$ material are an example of geometric shapes that could exhibit resonances associated with this inductance, it will be appreciated that various other geometric shapes are also capable of resonance, and inductance. For example, while a simple continuous sheet of $Cd_3As_2$ might not result in significant inductance capability, any closed geometry, such as a rectangle, or a spiral can be capable of such. Dimensions selected may be important to actual results achieved.

Such patterns may be provided on any suitable insulative, substantially non-conductive substrate, examples of which include quartz (e.g., silica), high resistance silicon, silicon carbide, or various other substrates that will be apparent to those of skill in the art.

While a plurality of stripes or dots of the 3D-DSM material are an example of a geometry capable of exhibiting inductance, those of skill in the art, in light of the present disclosure, will appreciate that numerous other possible geometries could also provide such characteristics. Examples of such include stripes, dots, spirals (including square or rectangular spirals), zig-zag or chevron patterns, and the like, where the shape is a closed shape, that defines an interior surface, where the material is deposited on a substantially non-conductive substrate.

By way of further example, the width and/or length of such geometry portions may be relatively small, e.g., from about 1 μm to about 500 such as from about 50 μm to about 200 Stripes actually formed as described herein had widths of 70-100 and lengths of 100 to 140 Dots or discs, formed as described herein, had diameters of about 125 to about 175

As described herein, the particular geometry dimensions of the separated portions can affect at what frequency the resonance occurs at.

The thickness of the applied portions may be any desired thickness, although it will typically be relatively thin, although significantly thicker than the essentially 2D graphene materials. For example, thickness may be at least 10 nm, at least 50 nm, no more than 10 μm, such as from 50 nm to 10,000 nm. The films deposited as described herein had thicknesses of 200 to 400 nm.

As further described herein, the input (e.g., an incident electromagnetic wave) used to actuate the inductive structure may be configured to be in a direction that is particularly oriented relative to the orientation of the geometric patterns of the 3D-DSM material on the substrate. For example, as described herein, perpendicular orientation of the input, relative to the longitudinal direction of the employed stripes geometrical pattern results in a desired resonance. Of course, for other geometry patterns, the orientation may be somewhat different. For instance, in an individual stripe, an electromagnetic wave propagating in plane may be used as the excitation. In other words, with an individual 3D-DSM inductor structure (e.g., an individual stripe), to maximize inductance one could excite the 3D-DSM structure by orienting the electromagnetic field orthogonal relative to the orientation used when exciting an array.

In configurations including a series or array of stripes or other geometries, the stripes or other structures provide for inductance, and the gap between such stripes or similar structures serves as a capacitor, such that an array type structure provides a series LC resonant circuit. Examples herein describe measurement of the resonance associated with such structures. The inductance of such circuits was probed and evaluated as described herein by looking at the LC resonance of such a circuit. The whole array is a series LC circuit, so that the array could be termed "a circuit" containing 3D-DSM inductors.

The present disclosure also provides methods for fabricating such structures capable of induction. For example, such an insulative non-conductive substrate for integrated circuit manufacture may be provided. A polymer may be applied adjacent to (e.g., over) the substrate. The polymer layer may be patterned (e.g., in an inverse of the geometry eventually desired for the 3D-DSM material). Such patterning may result in a portion of the underlying substrate being exposed. By way of example, in an embodiment, the polymer layer can include a first polymer portion and a second polymer portion that are separated from one another by the substrate therebetween (i.e., a gap is provided). The 3D-DSM material may then be applied over the patterned polymer layer, the 3D-DSM material being deposited into locations so as to cover the previously exposed substrate, as well as over the patterned polymer layer. Finally, the polymer layer may be removed (e.g., peeled) from the substrate, along with any 3D-DSM material applied thereover. This leaves a desired geometric pattern of the 3D-DSM material in the desired closed geometric shape, on the substantially non-conductive substrate material, where such structure is capable of inductance. Such methods can be used to form an individual stripe or other geometric shape (e.g., stripe, dot, etc.), or a plurality of such shapes. The closed shape geometry is capable of serving as an inductor in an integrated circuit. In configurations including a plurality of such shapes, the gap between such shapes serves as a capacitor.

The present disclosure proposes methods of manufacture that are compatible with current integrated circuit and CMOS manufacture. For example, the 3D-DSM material can be applied over the polymer layer at a temperature of less than about 110° C., at least 95° C., such as from 95° to 100° C.

An annealing step performed after such application of the 3D-DSM material can serve to increase the grain size of the applied 3D-DSM material. Such annealing may occur at temperatures of less than 600° C., at least 350° C., such as from 350° to 500° C., or 400° C. to 500° C. The pressure during such annealing may be higher than that during deposition of $Cd_3As_2$ or other 3D-DSM material (e.g., near atmospheric pressure, under argon or another suitable inert gas, as compared to vacuum conditions). Under such annealing conditions, the $Cd_3As_2$ or other 3D-DSM material does not decompose, even though at elevated temperature.

The inventors' publication "Manifestation of Kinetic Inductance in Terahertz Plasmon Resonances in Thin-Film $Cd_3As_2$" Mar. 13, 2019, ACS Nano 2019 13 (4), 4091-4100, is herein incorporated by reference in its entirety.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings.

FIG. 1AA shows an SEM image of the 400 nm thick film $Cd_3As_2$ after being annealed.

FIG. 2AA shows a transmission line model for transmission through thin film (e.g., where film thickness<<λ), where intraband conductivity could be modelled as series resistance, R, and kinetic inductance, $L_k$, providing the Drude dispersion.

FIG. 6A shows the effect of polarization, showing transmission spectra through thin film $Cd_3As_2$ stripes for incident terahertz beam polarization perpendicular (dotted) and parallel (solid) to the stripes. Whereas parallel polarization yields a Drude response, perpendicular polarization results in a Lorentzian response characteristic of a plasmonic resonance. The dashed lines indicate fits of the measured data to Drude and Lorentzian models.

FIG. 6AA shows an equivalent or analogous circuit schematic representation of the response along the two orthogonal (i.e., parallel and perpendicular) polarizations. Transmission response perpendicular to the stripes could be modelled with a series R-L-C circuit, where Cg and Lg are defined by geometry, while the total L contains contributions from geometric as well as kinetic inductance.

FIG. 6B illustrates the effect of annealing, where the solid and dotted curves represent transmission through a sample before and after annealing, respectively. Resonance blue shift, larger Q-factor, and larger extinction is observed after annealing, which is consistent with a longer $\tau$ as observed from transmission through un-patterned films and larger n as observed in Hall measurements.

FIG. 6C illustrates the effect of decreasing the geometric dimensions of the stripe or other geometry of the 3D-DSM material. The solid and dotted curves correspond to transmission through samples having width (W)=100 µm and length (L)=220 compared to width (W)=70 µm and length (L)=140 respectively. Overall, decreasing the geometric dimensions leads to a blue shift (shorter frequency) of the resonance frequency.

FIG. 7AA schematically illustrates ultrafast carrier relaxation pathways in the 3D-DSM (e.g., $Cd_3As_2$) geometric films.

DETAILED DESCRIPTION

I. Introduction

Figure 1A:
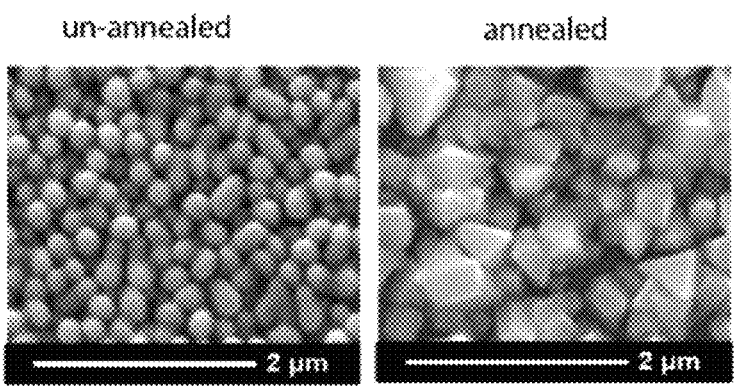
FIG. 1A shows an SEM image of un-annealed 400 nm thick film $Cd_3As_2$ prepared using thermal evaporation.

Terahertz plasmons are electron-density oscillations that have a fundamental origin arising from the inertia of electrons. However, in a more general case, electron inertia results in an inductive behavior of the material's response, which leads into the so-called "kinetic inductance". From this perspective, Weyl and Dirac semimetals (3D-DSMs) can be an excellent platform for kinetic-inductance-based devices for application in Radio Frequency (RF) and other electronics. In this context, inductors are an important passive component of many (RF) and other integrated circuit systems. With the ongoing exponential growth of portable consumer electronics relying on wireless communications, constant innovation is necessary. In this regard, the size and performance of RF inductors has become an increasingly significant bottleneck factor of the overall size, imposing performance limitations on many systems. Although most of the system components of a RF integrated circuit (IC) have scaled down with Moore's law, inductors in high-end RF ICs have not been able to follow the pace of continual miniaturization.

While numerous efforts have been made to improve the performance of integrated inductors, such as stacked structures for smaller inductor area, and 3-dimensional inductors based on Micro-Electro-Mechanical Systems (MEMS) techniques, significant problems remain. The problem of achieving a reduced footprint without significantly degrading the quality factor remains challenging. Square spiral inductors using metallic traces are sometimes selected due to the ease of their design. Such spiral inductors include a number of metal segments generally forming a spiral shape, and rely on the self-mutual inductance provided by the spiral coil configuration.

However, an additional source of inductance can come from kinetic inductance, although in conventional metallic (e.g., copper) spiral inductors, the kinetic inductance is negligible. However, in Dirac materials such as graphene or $Cd_3As_2$, the contribution of kinetic inductance can be significant. The problems with using 2-D graphene sheets as a material for construction of an inductor are significant. According to embodiments of the present invention, use of 3D-DSM materials (e.g., $Cd_3As_2$) can address many such issues, and provide for ultra-compact inductor devices. For example, the present configurations based on 3D-DSM materials may provide 4× larger inductance as compared to an intercalated graphene configuration, while providing quality factors (Q) of greater than 2, or greater than 3, such as ~5 to ~10, or even hundreds (e.g., ~100 to 1000). Actual Q obtained may depend on geometry and frequency (e.g., at RF frequencies, Q values may be far higher than those demonstrated in the Examples herein).

In an embodiment, the present disclosure provides an ultra-compact inductor for use in an integrated circuit, including a 3D-DSM material formed into a geometric shape capable of inductance. A non-conductive substrate is also provided, on which the 3D-DSM material is deposited, in the desired geometric shapes. For example, the non-conductive substrate may serve to insulate any separated portions of 3D-DSM material from one another, allowing them to be capable of resonance, and inductance (e.g., particularly kinetic inductance). Any such provided separation "gap" between such 3D-DSM inductor structures serves as a capacitor.

Figure 3A:
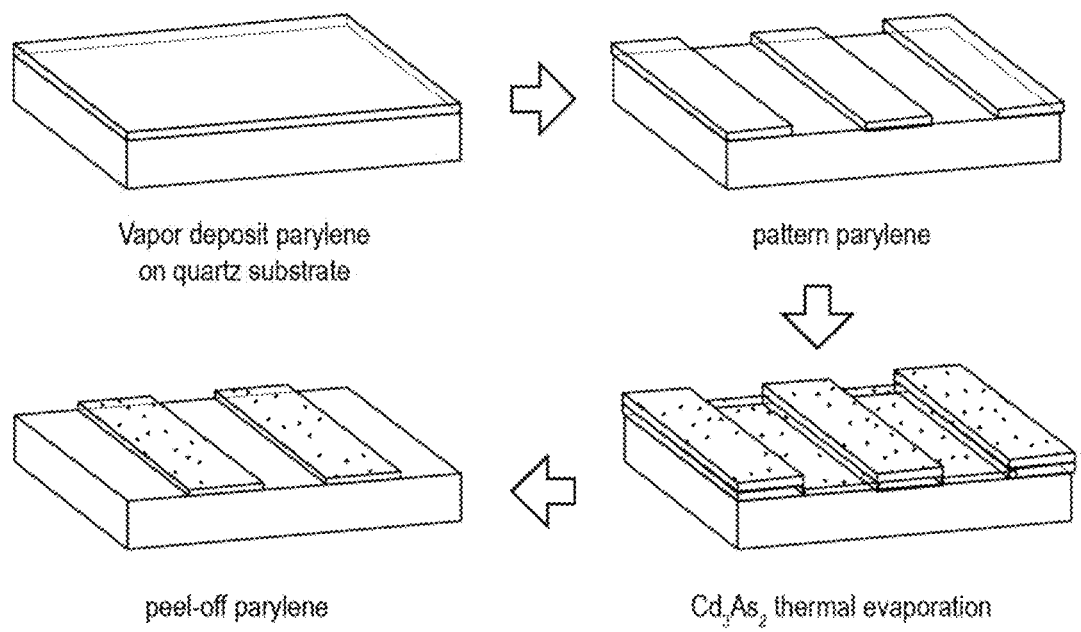
FIG. 3A is a schematic illustration of an exemplary low temperature patterning process using polymer delamination to result in the 3D-DSM material in a desired geometric shape capable of inductance.
Figure 3B:
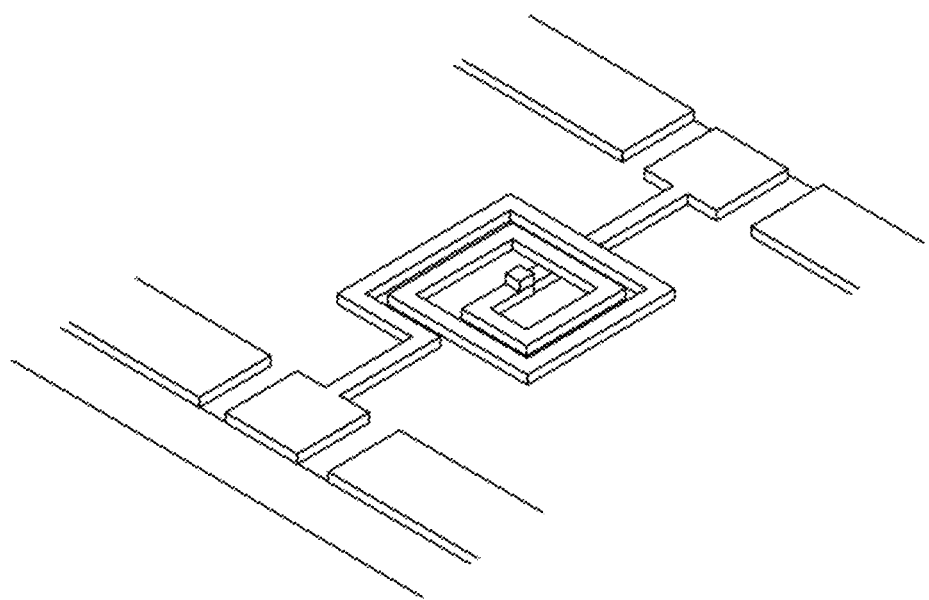
FIG. 3B illustrates another geometric shape capable of inductance (e.g., a spiral geometry).

In an embodiment, the portions may actually be discontinuous relative to one another (e.g., separate stripes or the like), although this is not necessarily required. As noted, the structure could be as simple as an individual stripe, dot or other closed shape on the insulative, non-conductive material. Numerous individual or series or arrays shapes are possible. For example, a spiral (e.g., square or rectangular spiral) could be provided, where the portions may be connected to one another, but are separated from one another (i.e., defining a gap), as is the case in a spiral deposited on a substrate (e.g., as shown in FIG. 3B). Thus, the structure may be as simple as an individual closed portion of the 3D-DSM material, on the non-conductive substrate. In other embodiments, a series or array of such structure may be provided, where such individual portions may be discontinuous relative to one another, or at least configured to have a separation from one another, with a non-conductive material (e.g., the substrate) therebetween (i.e., defining a gap). As described herein, arrays or series of such individual structures actually provides a series LC circuit (where the closed shape of the 3D-DSM provides the L and the gap provides the C).

II. Exemplary Systems and Methods

Dirac semimetals, based on a peculiar quantum material with linear band dispersion and gapless electronic excitations, may facilitate profound technological advancements. Dirac cone physics, in these materials, results in relativistic charge transport, suppression of backscattering, saturated light absorption, and electronic chirality. Such makes possible exciting advancements in applications such as low-power electronics, optoelectronics, quantum computing, and beyond. Recent developments in graphene and topological insulators (TIs) have drawn attention towards the strong coupling of electromagnetic radiation as plasmons in these materials. This opens a new frontier of sub-wavelength confinement and strong light-matter interaction, enabling electron-plasma-wave devices and inducing non-linear effects.

Such plasmons, in general, exhibit two distinct features: (i) in contrast to parabolic band materials, the plasma oscillations here are predominantly quantum mechanical in nature (since h appears as a leading term in the plasma dispersion relation). Furthermore, these charge oscillations cease to exist as the charge density (n) vanishes when the Fermi level is at the Dirac point ($\varepsilon F=0$). In addition, when compared to parabolic band materials, (ii) the linear energy dispersion in 3D-DSM materials results in a lower-order dependence of the plasmon resonance frequency ($\omega p$) on n, such that plasmon resonances predominantly lie at terahertz frequencies. The presence of strong coupling of terahertz radiation, in conjunction with tunable response and a long momentum scattering time ($\tau$) in these materials, may play an important role in the burgeoning field of terahertz electronics and optoelectronics. While two-dimensional (2D) graphene exhibits practical problems relative to its use in such devices, 3D-DSM materials, such as cadmium arsenide ($Cd_3As_2$), may provide distinct advantages.

The three-dimensional nature of 3D-DSM materials results in a few distinctions from their two-dimensional counterparts. For example, there is a fundamental difference in terms of their dispersion relations compared to those in 2D-Dirac materials. In 3D-DSM materials, the plasma frequency is characterized by $\omega p \propto \varepsilon F \propto n^{1/3}$, while in 2D-Dirac materials, $\omega p$ has a $n^{1/4}$ dependence. In general, a particular charge density dependence of long wavelength plasmons in massless Dirac systems is of the form $\omega p \propto n^{(D-1)/2D}$, where D is the dimensionality of the system. Angle-resolved photoemission spectroscopy (ARPES) studies on $Cd_3As_2$ show a Fermi velocity $vF \cong 2 \times 10^6$ m/s which is approximately twice that of graphene. Interestingly, this has a direct implication on plasmon characteristics; in general, higher $v_F$ (and longer $\tau$) produce plasmon resonances with larger quality-factors (Q). This is similar to what occurs in parabolic band materials, where low effective masses and long momentum scattering times are associated with high Q-factors in plasmonic resonances. Another outcome of a long $\tau$ in DSMs is a large kinetic inductance ($L_k$) arising from the higher kinetic energy of carriers and given by $L_k=\tau/\sigma_0$ with $\sigma_0$ being the low-frequency limit of its AC conductivity. In conventional metals, with $\tau\sim$fs and $\sigma_0>10^7$ S/m, kinetic inductance is typically negligible. Kinetic inductance in DSMs exhibit significant kinetic inductance, such that the overall inductor footprint can be reduced by 1.5 times or more, as compared to a conventional metallic counterpart.

From this perspective, practical applications of kinetic inductance hold remarkable prospects for downscaling the size of radio-frequency and microwave circuits (or other circuits), where the large size of metal-based inductors has been a bottleneck. However, issues with large-area synthesis of high quality (e.g., high purity) materials for such applications still loom. Benefitting from their bulk nature (i.e., they have a thickness, that even while thin, is significantly greater than for 2D graphene sheets), 3D-DSM materials are less susceptible to substrate and bulk phonon and scattering effects, degradation due to lithographic processes, and the like. From a practical perspective, this can be beneficial for kinetic inductance-based devices, such as ultra-compact inductors. In addition, plasmon resonances in 3D-DSM materials lie in the terahertz frequency range. Hence, the use of 3D-DSM materials as a materials-platform for future microwave and terahertz devices could lead to many valuable applications, including, but not limited to, electron plasma-wave based devices such as high responsivity resonant detectors, plasmonic terahertz sources, and the like. Another characteristic of linear energy dispersion materials is the ultrafast recombination dynamics of photo-excited Dirac fermions, which could be exploited towards the design of ultrafast optoelectronic devices.

The present disclosure presents a direct demonstration of spectrally-narrow terahertz plasmon resonances in patterned $Cd_3As_2$ resonant plasmonic structures. This observation is attributed to the exceptionally long momentum scattering time measured in the present films, and is a direct outcome of the large $v_F$ defining the Dirac dispersion of this material. Described herein is synthesis of polycrystalline thin film structures capable of induction, using thermal evaporation techniques, as well as test results detailing their structural, electrical, and terahertz characteristics. Furthermore, the present disclosure describes how annealing of the as-deposited films under an inert environment results in reorientation and recrystallization of the films yielding larger grains and corresponding improvements of both DC and high-frequency electron transport properties.

In order to effectively couple the incident terahertz radiation into terahertz plasmons, the films were patterned using a polymer-based delamination technique, devoid of any lithography or milling processes, thus substantially preserving the properties of the original film materials. High quality factors, as high as Q~3.7±0.2 are in agreement with the modelled response derived from extracted Drude parameters and a low refractive index dielectric environment as provided by the quartz substrate employed. Of course, other insulative, non-conductive substrates (e.g., silicon) could also be used. Since the initial experiments, subsequent examples are now exhibiting even higher quality factors, such as ~5 to ~9.

Systematic full-wave analysis provides insights into the physical origin of these resonances and aids in explaining the differences between the observed response and that of dispersion-free metals. Using time-resolved techniques, strong photo absorption was also demonstrated for the present films, resulting from doubly degenerate linear bands in $Cd_3As_2$. Such photo-excited carriers recombine in <40 ps. Excitation of photo-carriers in patterned samples leads to a dynamically tunable ultrafast plasmon response, which can enable future development of a wide variety of terahertz capable optoelectronic devices. The present disclosure introduces and highlights 3D-DSM materials as prospective constituents for terahertz applications and beyond.

Figure 1B:
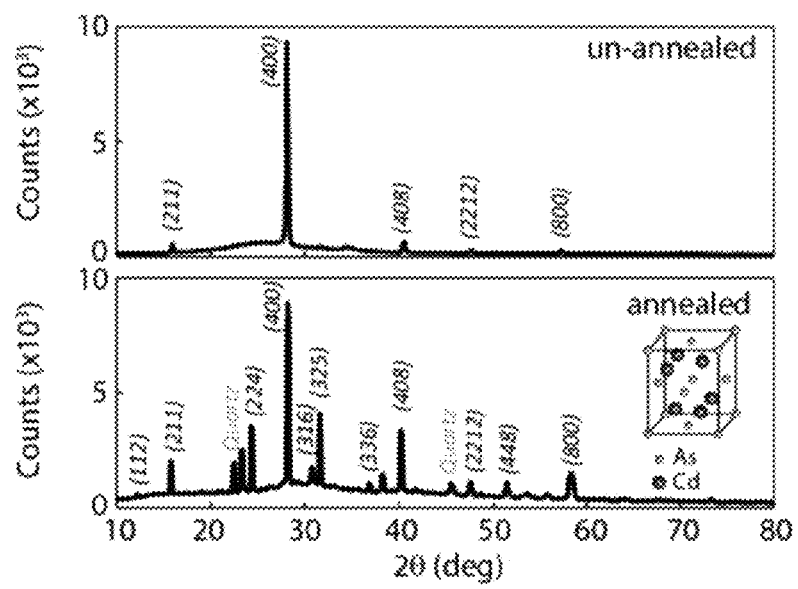
FIG. 1B shows 20 XRD spectrum showing diffraction peaks from polycrystalline film corresponding to the tetrahedral lattice unit of $Cd_3As_2$, as shown in the inset.
Figures 1C, 1D:
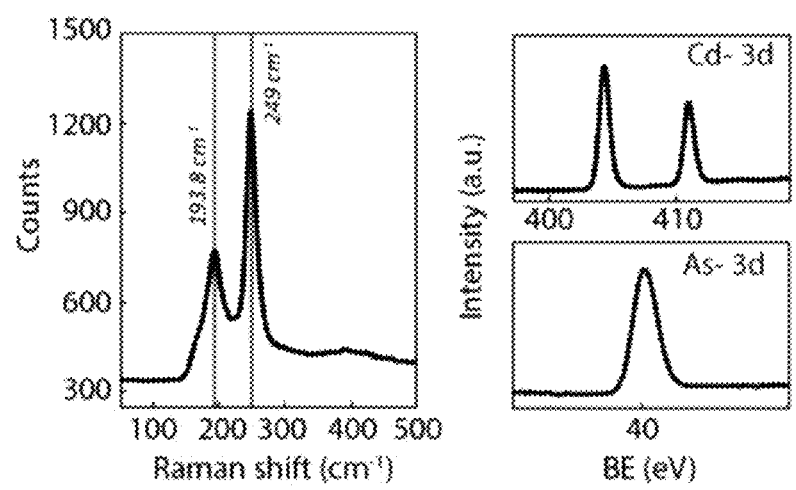
FIGS. 1C-1D show Raman and XPS data obtained from the annealed films, confirming the molecular bonds and oxidation states of Cd and As in the desired forms.
Figure 9A:
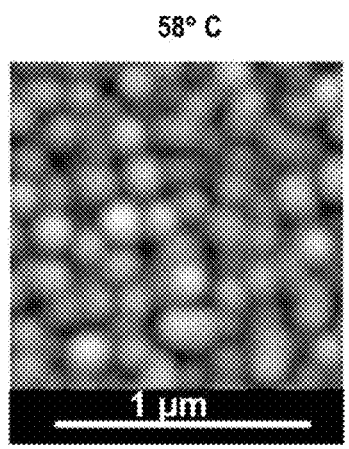
FIGS. 9A-9C show SEM images for thermal deposition at different substrate temperatures—58° C., 78° C., and 98° C., respectively. As shown, grain size increases with increasing substrate temperature, and showed higher THz conductivity and momentum scattering time, $\tau$. At substrate temperatures higher than 100° C., no deposition occurred.
Figure 9B:
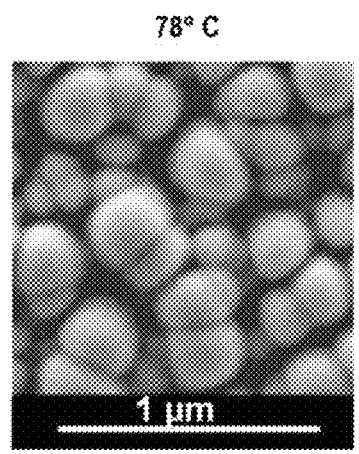
Figure 9C:
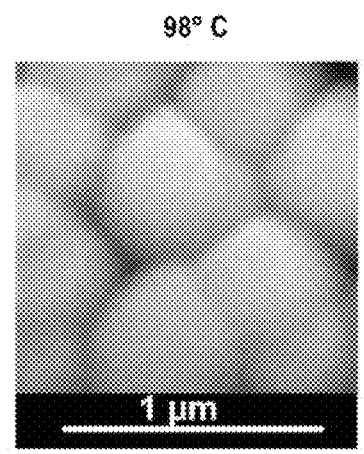

Relatively large area, continuous films of $Cd_3As_2$ were thermally evaporated from a lumped $Cd_3As_2$ source [American Elements, Product Code #CD-AS-05-L] on to quartz substrates under conditions as detailed herein. Other methods of deposition or growth may also be possible (e.g., various molecular beam epitaxy, or other approaches). The major parameter affecting the grain size and structural properties was found to be the substrate temperature, where improved chemical and structural properties were obtained at a substrate temperature of ~98° C. (see FIGS. 9A-9C). FIGS. 1A-1C show structural and compositional characterization of the polycrystalline films. As grown polycrystalline films, when annealed in Ar gas at 450° C., recrystallized to form larger grains with typical lateral dimensions of 200 to 500 nm (e.g., ~400 nm), providing a continuous conductive path across the sample, as shown in FIG. 1A. In annealed samples, sharp crystalline grain facets were observed. Consequently, X-ray diffraction (XRD) analysis [Bruker D2 PHASER] revealed a family of diffraction peaks corresponding to the tetrahedral structure, $I4_1cd$, of $Cd_3As_2$ (see FIG. 1B).

Figure 10:
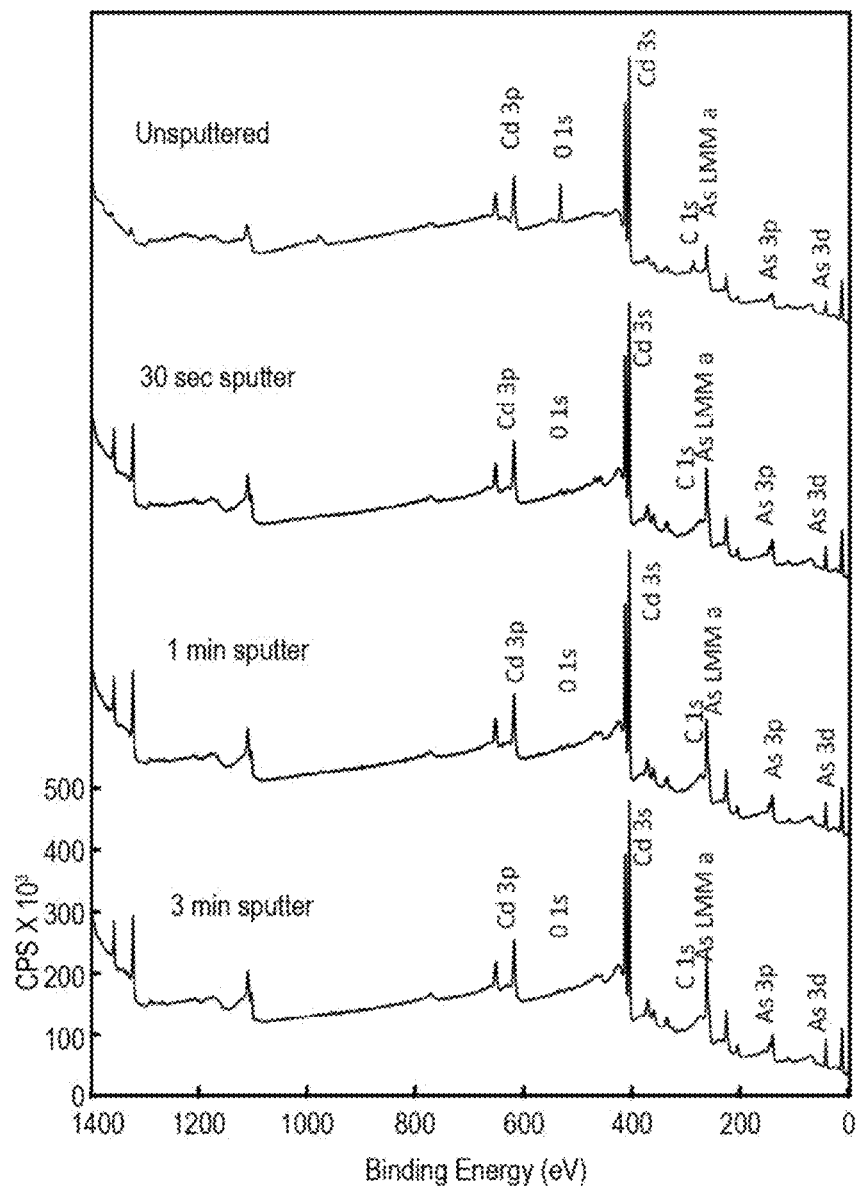
FIG. 10 shows survey scan of x-ray photoemission spectroscopy showing the oxygen XPS peaks for unsputtered film at ~531 eV. The peaks corresponding to oxygen and carbon disappear upon Ar sputtering (etching), showing surface oxidation and contamination. 3 minutes of Ar sputter corresponds to ~10 nm of etched depth.
Figure 11:
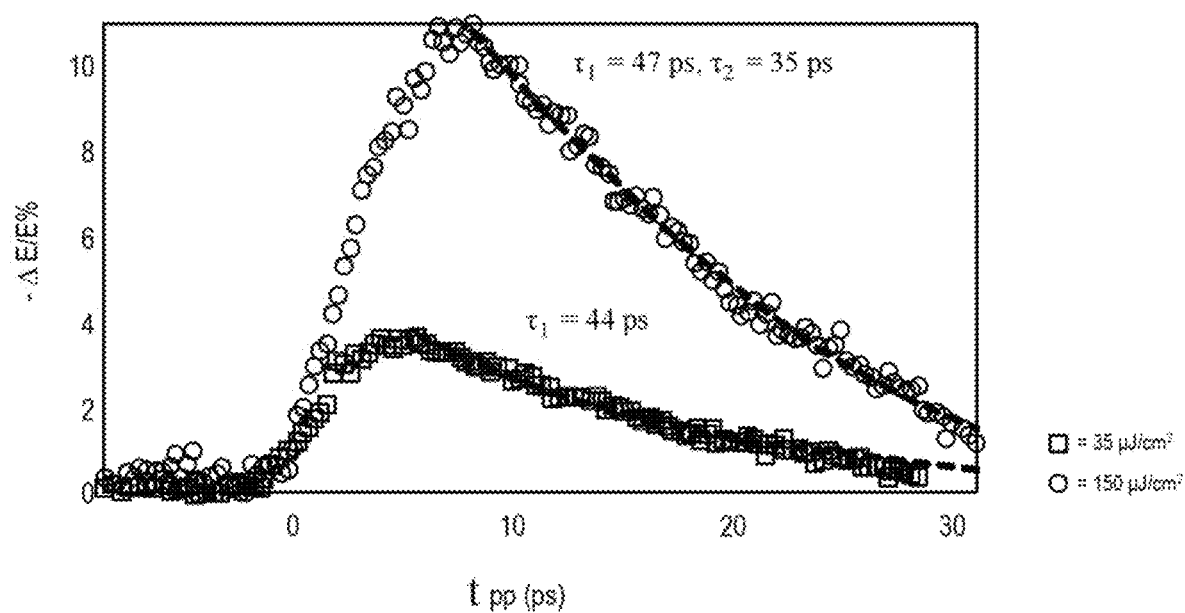
FIG. 11 shows the ultrafast carrier recombination dynamics in $Cd_3As_2$ films excited with 800 nm pump pulses having fluence of 35 µJ/cm$^2$ and 150 µJ/cm$^2$. The recombination lifetime of carriers, n, was fitted to bimolecular and monomolecular rate equation, respectively, given by $dn/dt = -k_1 n - k_2 n^2$. The time constants ($\tau_1 = 1/k_1$ and $\tau_2 = 1/k_2 n$) obtained from the fit to the rate equation are provided as insets in the Figure.

This XRD data is in good agreement with existing powder XRD data. Molecular composition was confirmed using Raman spectroscopy, using a 488 nm excitation, where as depicted in FIGS. 1C-1D phonon vibrational modes at ~194 $cm^{-1}$ and ~249 $cm^{-1}$ were observed. To validate the oxidation states of elements, binding energy was measured in X-ray photoemission (XPS) spectrum from Cd 3d and As 3d peaks, favoring oxidation state corresponding to $Cd_3As_2$. Partial oxidation of films was also observed, as supported by XPS data (see FIG. 10), where oxidation of the top ~5-10 nm of the film was observed. Oxidation of the film was found to be self-limiting.

Linear dispersion in energy-momentum (E-k) space manifests as a unique dependence of plasmon frequencies on the number of carriers: as opposed to the characteristic square-root dependence ($\omega_p \propto n^{1/2}$) for parabolic band semiconductors, DSMs exhibit lower-order dependences. The schematic representation in FIGS. 2A and 2AA illustrates the effect of intra-band transitions excited by THz probe fields producing a free carrier (Drude) response at terahertz frequencies.

Figure 2A:
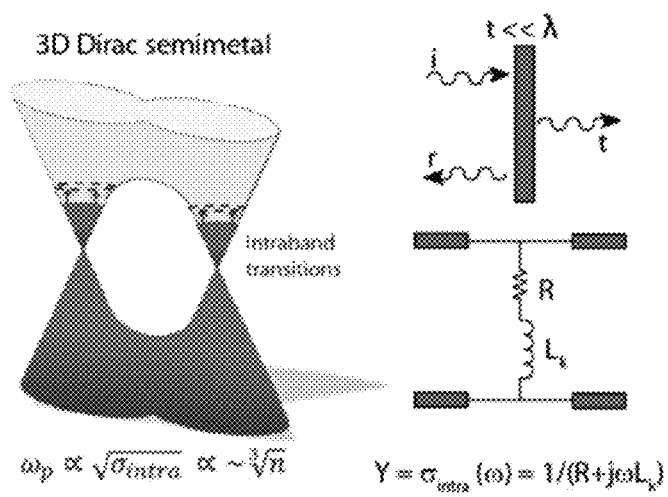
FIG. 2A is a schematic representation of intra-band transitions at low-energy terahertz frequencies.

Assuming a Drude model, i.e. $\sigma(\omega)=\sigma_0/(1+i\omega\tau)$, the frequency dependent complex admittance, $Y=1/\sigma(\omega)$, representing the film is modelled as the series connection of a series resistance $R=1/\sigma_0$ and the kinetic inductance $L_k=\tau/\sigma_0$ as schematically depicted in FIG. 2AA, 2B. Terahertz transmission through the thin-films was measured using THz time domain spectroscopy (THz-TDS). The complex conductivity was extracted using Fresnel coefficients from the transmission through the films. By fitting the experimentally extracted frequency-dependent conductivity depicted in FIG. 2B-2C to a Drude model and employing a nominal thickness for the film of ~220 nm, as confirmed by SEM, the following parameters were extracted: $\sigma_0=3.5\pm0.5\times10^5$ S/m and $8\pm0.3\times10^5$ S/m before and after annealing, respectively. The corresponding Drude scattering times for the material before and after annealing, were found to be ~0.35±0.05 ps and ~0.70±0.05 ps, respectively. In general, across several samples, synthesized over time, the present process yielded $\sigma_0$ ranging from ~1×10$^5$ to ~5×10$^5$ S/m (before annealing) to ~3×10$^5$ to ~10×10$^5$ S/m (after annealing); with relaxation times ranging from ~0.3 to ~0.5 ps (before annealing) and ~0.7 to ~1.0 ps (after annealing). Relaxation times where $\tau$>1 ps can also be achieved.

Figure 2B:
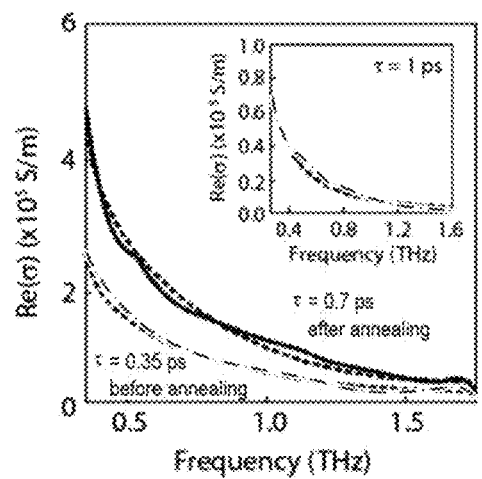
FIG. 2B shows extracted terahertz conductivity in the 0.4-1.6 THz frequency range for a film before and after annealing. The dashed curves correspond to fitting of the extracted data to a Drude model. Across several analyzed samples, the present process yields $\sigma_0$ ranging from ~1×10$^5$ S/m to ~5×10$^5$ S/m (before annealing) and from ~3×10$^5$ S/m to ~10×10$^5$ S/m (after annealing), with relaxation times ranging from ~0.3 ps to ~0.5 ps (before annealing) and ~0.7 ps to ~1.0 ps (after annealing).
Figure 2C:
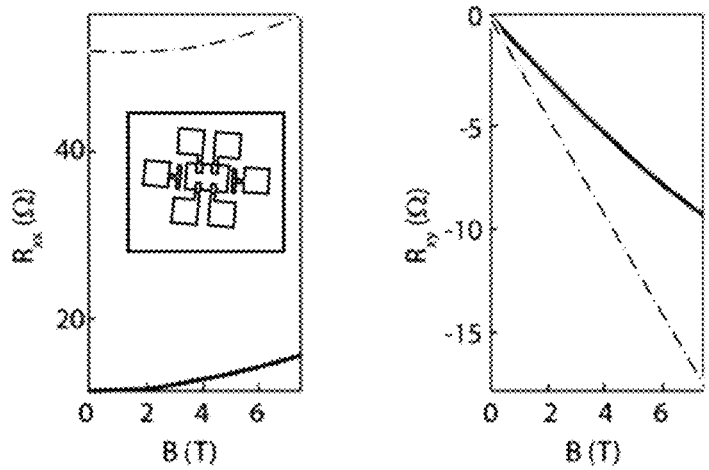
FIG. 2C shows Hall measurements before (solid) and after (dot-dash-dot) annealing. In general, low-frequency conductivity and Drude scattering time as well as DC conductivity were found to increase after annealing of the films.

For illustrative purposes, depicted in the inset of FIG. 2B is the extracted conductivity for a particular film with extracted relaxation time of ~1 ps. The deviations in the extracted parameters mainly stem from variations in materials quality across growths, whereas the uncertainty arises from spatial variations in film thickness as well as on the limited bandwidth of the terahertz spectroscopy system. In addition, we extracted DC conductivity and mobility from Hall effect measurements (see FIG. 2C). Measurements were performed on structures using bottom gold contacts, which bypass the problem of oxidation of the top film surface. Other high conductivity noble metals could alternatively be used for such contacts or coatings. Assuming a nominal thickness of 220 nm, DC conductivity and mobility for the un-annealed film were found to be ~5.5×10$^4$ S/m and ~400 cm$^2$/V·s, respectively; while annealing of the film increased these values to ~3.4×10$^5$ S/m and ~1,000 cm$^2$/V·s, respectively.

This observed increase in DC-extracted conductivity and mobility after annealing are consistent with the corresponding increases observed in THz-extracted parameters. However, the THz-extracted zero-frequency conductivity levels are larger than the DC-extracted ones. The differences in conductivity levels obtained from terahertz and DC measurements result from the distinct probe lengths at which transport is measured in these measurements. The transverse characteristic length at which terahertz illumination probe electronic transport is on the nm scale. From this perspective, in the case of terahertz measurements, charge transport at high frequencies, is largely, on average, limited within grains, thus, micrometer scale effects such as grain boundaries do not significantly affect transport.

In the case of DC measurements, transport is measured using longitudinal and transverse Hall bars, placed 20 µm apart, in the Van der Pauw geometry; hence conductivity is measured across several grains. From Hall measurements, the carrier density was estimated to be 1.6×10$^{19}$ cm$^{-3}$ and 9.8×10$^{18}$ cm$^{-3}$ in annealed and un-annealed films, respectively. Such high doping densities are not unusual for films deposited using thermal evaporation of $Cd_3As_2$, while more moderate n-type doping often occurs in films prepared using other techniques. The thermal evaporation techniques described herein are advantageous, and in at least some embodiments, are employed, although it will be appreciated that other methods may also be suitable for preparation of the 3D-DSM layer. Based on DFT modelling, similar doping concentrations were estimated to form a Fermi level of ~200 meV, where, carriers occupy the linear regime and thus showcase Dirac phenomena.

Figure 12A:
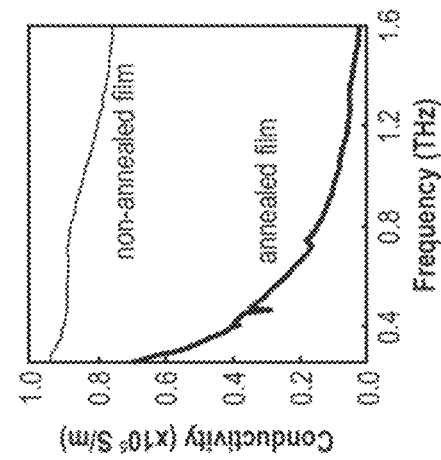
FIG. 12A shows optical conductivity versus frequency for another sample, before and after annealing (at 370° C.). The annealing process resulted in rearrangement of crystals, and increased momentum relaxation times to $\tau$>1 ps ad larger zero-frequency optical conductivity.
Figure 12B:
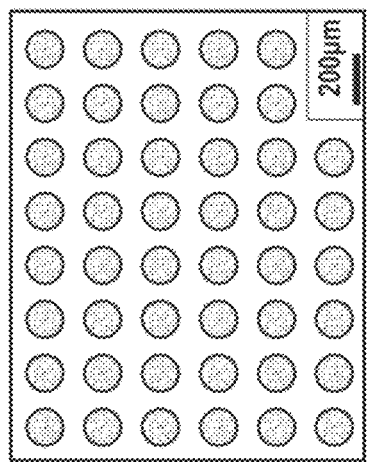
FIG. 12B shows an image of an example of another pattern in which a 3D-DSM material can be patterned, e.g., into plasmonic discs.
Figure 12C:
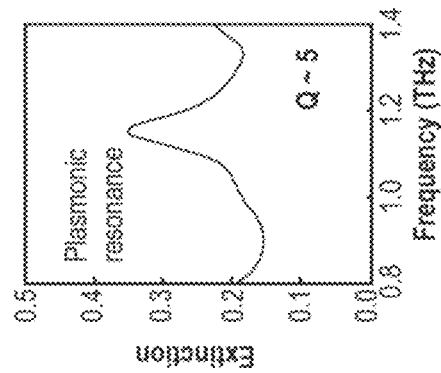
FIG. 12C shows extinction versus frequency for the pattern shown in FIG. 12B, which exhibited a strong plasmonic resonance, with Q~5, at ~1.1 THz.

Localized plasmon resonances in thin-films of $Cd_3As_2$ can be characterized. This required patterning the films to enable coupling of incident terahertz radiation into plasmon modes. This has been quite a challenge with 2D sheets of graphene where extensive efforts have been made to reduce the degradation of mobility and T due to the typically employed lithographic processes. Here, the present inventors circumvented the need for developing an etching process for $Cd_3As_2$ by adopting a unique approach of depositing on to patterned polymer films and subsequently delaminating the polymer. The non-destructive (solvent and wet-process free) approach and the fact that $Cd_3As_2$ deposition is reserved as the last or close to the last step before polymer peel-off, ensures the same quality of $Cd_3As_2$ as obtained in un-patterned films. The fabrication process is illustrated schematically in FIG. 3A. As shown, $Cd_3As_2$ was patterned into thin elongate stripe structures (e.g., ribbons), which structures are capable of plasmonic resonance, and inductance. It will be apparent that numerous other patterns are also possible. For example, FIG. 3B illustrates a spiral geometry (e.g., a square or rectangular spiral). FIG. 12B illustrates a dot pattern geometry. The illustrated pattern of separated, plasmonic discs (or other array of geometries) exhibits a strong plasmonic resonance at ~1.1 THz, with a Q factor of ~5, even higher than various other configurations described herein. Those of skill in the art will recognize that numerous other possible geometries are possible, that are capable of plasmonic resonance, and thus could be used as the basis for construction of an inductor. The particular patterns prepared were designed to exhibit resonances below ~1.5 THz. It will be appreciated that other geometries may be selected to provide another resonance frequency (e.g., higher or lower).

The scalable response of plasma frequency on the patterned structures could be approximated, under quasi-static limit, by solving Maxwell's equation for polarization fields along the boundaries. Under a thin film approximation, provided that the thickness of the film is much smaller than a skin depth, for stripes of width W, the expression for the first plasmonic resonance ($\omega_p$) is given by equation (1), below:

$$\omega_p \propto \sqrt{\frac{\pi \sigma_0}{\epsilon_{avg} \tau W}},$$

where $\epsilon_{avg}$ is the average permittivity surrounding the stripes. Eqn. (1) is formally valid for a "zero-thickness" conductive sheet of zero-frequency dynamic sheet conductivity $\sigma_0$, i.e. $\sigma_0$ has units of S (rather than S/m). It is to be noted that such is not the "exact" case in the present samples, but is sufficiently close for the relevant calculations. For example, the general trends with respect to geometric dimensions and momentum scattering time predicted by Eqn. (1) still hold in the present experimental situation. Similar square-root dependence of resonance frequency on the structure dimensions and momentum scattering time has been also established for disk geometries.

Figure 4A:
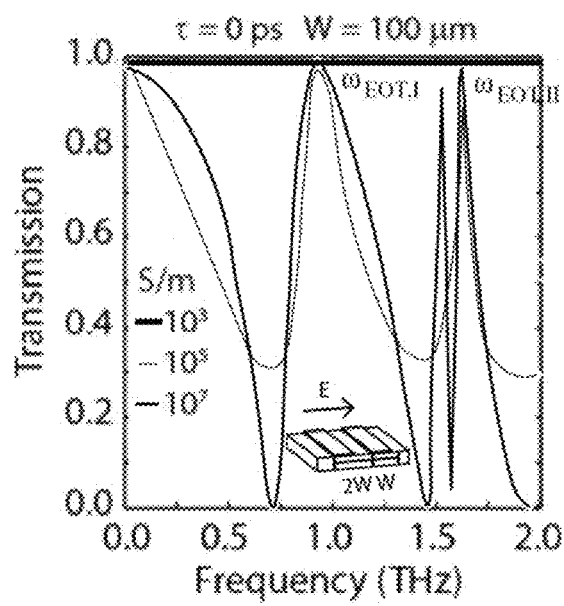
FIG. 4A shows simulated transmission spectra for a dispersion-less metal lossy metallic film patterned into stripes, for different conductivity values. LC and EOT resonances are observed as minima and maxima in the transmission spectra.

In order to account for the effect of film-thickness, full-wave numerical simulations were performed to understand the effects of $\tau$, $\sigma_0$, and W in the terahertz transmission through periodic stripe patterns (with conductivity modelled through a Drude model). To provide for a systematic analysis, one parameter was altered at each time while the others remained constant. First, by assuming $\tau$=0 and W=100 µm, the effect of varying $\sigma_0$ was analyzed. This situation corresponds to the film behaving as a "dispersion-free lossy conductor". Simulations were performed for $\sigma_0$=10$^3$, 10$^5$, and 10$^7$ S/m. These levels represent conservative estimates for conductivity in semiconductors, semimetals, and metals, respectively. As depicted in FIG. 4A, for a terahertz excitation (i.e., light or other input) polarized perpendicular to the stripes, three important features are observed: (i) at low frequencies, transmission drops following the characteristic low pass filter response of a capacitive grid (RC roll-off); (ii) this drop is then followed by a subsequent sharp increase in transmission, where transmission peaks at a geometrically defined extraordinary optical transmission (EOT) resonance, $\omega_0$; and (iii) when altering the conductivity of the film, the position of the resonance, $\omega_0$, which is geometrically defined, remains substantially constant.

Figure 4B:
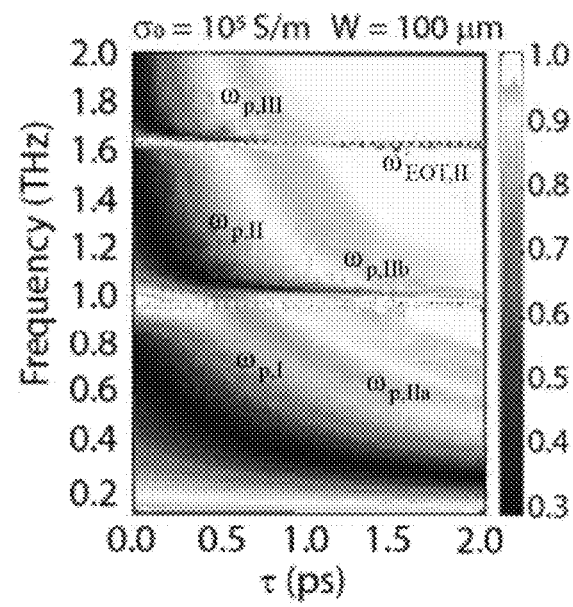
FIG. 4B shows transmission versus frequency as a function of $\tau$. A red shift of the LC resonances, together with appearance of higher order and hybrid modes is observed for long $\tau$. These effects are a manifestation of the large kinetic inductance.

Next, by assuming $\sigma_0=10^5$ S/m and W=100 µm, the effect of varying τ was analyzed. FIG. 4B depicts shaded-maps of the transmission spectra. The color originals are in the inventor's publication already incorporated by reference. As τ is increased, the following trends are observed: (i) a transition of the spectrum from geometrically defined resonances into several branches of localized plasmonic modes, which are manifested by spectrally-narrow dips in transmission; (ii) a spectral-narrowing of the resonances (larger Q-factor); and (iii) a red-shift in their position. It is interesting to note that the observed red-shift and narrowing of the resonances can be explained on basis of a series RLC equivalent circuit, where the resonance frequency follows:

$$\omega_p \propto \frac{1}{\sqrt{C(L_g + L_k)}}$$

and the quality factor follows:

$$Q \propto \sqrt{\frac{L_g + L_k}{C}}.$$

Figure 4C:
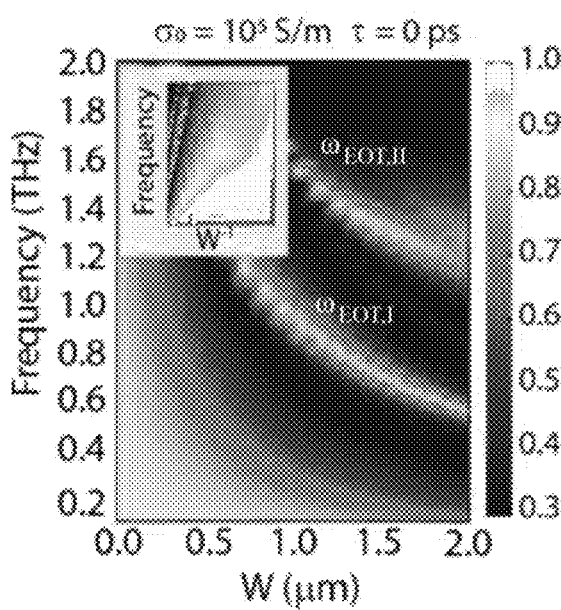
FIG. 4C shows geometric scaling of the resonances for $\tau$=0 ps. Characteristic square root dependence ($W^{-0.5}$ dependence) on resonance frequency for plasmon resonances was observed.

From this point of view, as τ is increased, the kinetic-inductance ($L_k$) can become comparable or larger than the geometric inductance ($L_g$). Therefore, the resulting resonances become dominated by $L_k$ and thus constitute a direct manifestation of electron inertia. It is to be noted that dips in transmission would also appear in dispersion-free metal gratings, i.e. τ=0 ps, however these manifest as broad valleys formed between EOT peaks imposed with base-level terahertz transmission determined by the film conductivity. In contrast, the spectrally narrow resonance dips observed herein, which are associated with plasmon coupling, are only possible in case of conductivity dispersion imparted by a long momentum scattering time. Another interesting observation from FIG. 4B is that when increasing τ, two branches are observed to appear near the second order resonance branch, $W_{p,II}$: a pure plasmonic resonance, $\sigma_{0,IIa}$, and an hybrid mode, $\sigma_{p,IIb}$; with both branches associated with spectrally-narrow resonances. However, whereas the extinction at $\omega_{p,IIa}$ slowly varies when altering τ, the extinction at $\omega_{p,II}$ sharply decreases when τ is increased and $W_{p,II}$ approaches $\omega_0$. Finally, by assuming $\sigma_0=10^5$ S/m as well as τ=0 (FIG. 4C) and τ=0.5 ps (FIG. 4D), the effect of varying W was analyzed.

Figure 4D:
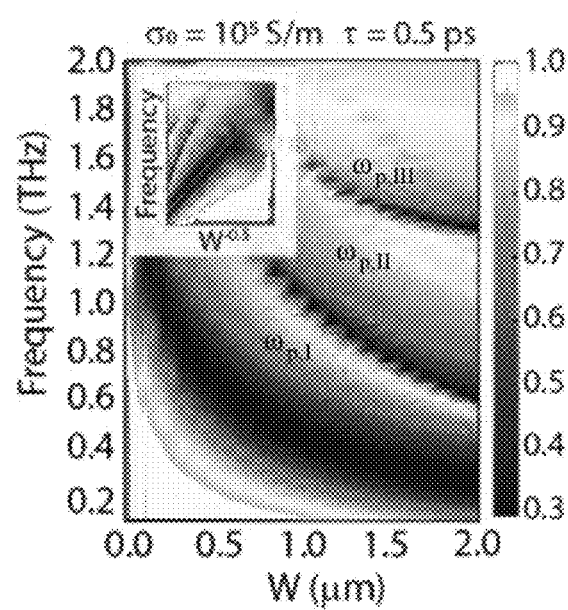
FIG. 4D shows geometric scaling of the resonances for $\tau$=0.5 ps. Characteristic square root dependence ($W^{-0.5}$ dependence) on resonance frequency for plasmon resonances was observed.

For a typical case representing the 3D-DSM materials used (e.g., where τ~0.5 ps), a $W^{-0.5}$ dependence is observed (see inset in FIG. 4D). The latter observation holds for both the $\omega_{p,I}$ and $W_{p,II}$ branches. Analysis shows that the plasmonic modes in 3D-DSMs are not only characterized by spectrally narrow dips in transmission (in contrast to broad LC resonances as is the case in dispersion-free metals), but also by: (a) a dynamic behavior (with regard to the resonance position) when altering either τ or σ, as well as by (b) a characteristic $\omega_p \propto W^{0.5}$ dependence. By way of example, a spectrally narrow dip in transmission may be such as those seen in FIGS. 4A-4D, e.g., where the width of the dip is no more than about 1 THz, 0.75 THz, or 0.5 THz, where the transmission drops quickly, and then rise quickly thereafter, e.g., as frequency increases. The observed spectrally narrow resonances are indicative of desirable high Q factors. For example, the spectral width may be no more than about 1 THz, 0.75 THz, 0.5 THz, 0.4 THz, 0.3 THz, or 0.2 THz. The narrower the resonance, the higher the Q-factor.

Figure 5:
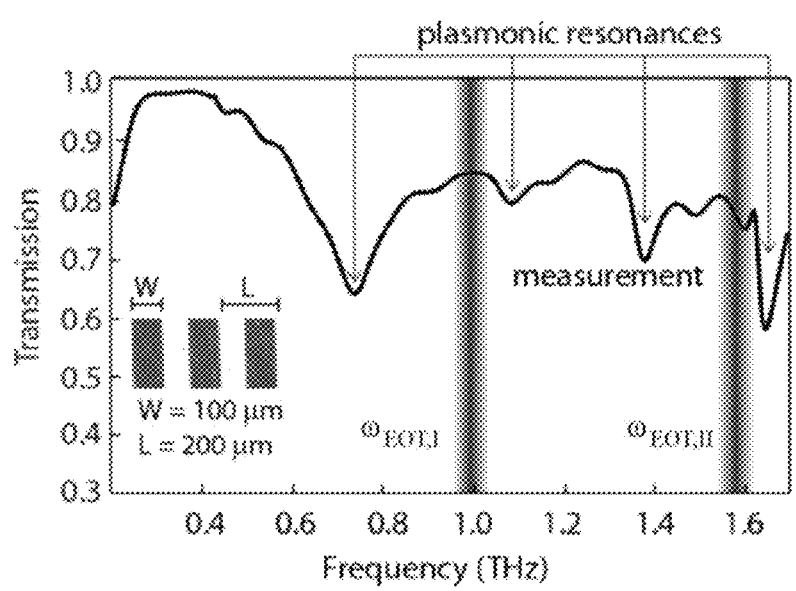
FIG. 5 shows transmission response of patterned stripe array showing multiple plasmon resonances (dips in transmission) and EOT peaks. The vertical shaded lines correspond to the simulated position of the EOT peaks.

The strong dependence of the resonances on τ is a manifestation of kinetic-inductance and can enable either: (i) resonances at much smaller frequencies ($\omega_{p,I}$) than the geometrically defined LC resonances in the metal case, or (ii) resonances with very large Q-factors ($\omega_{p,II}$) near $\omega_0$. Depicted in FIG. 5 is the measured transmission spectra through a stripe-patterned film with stripe width W=100 µm. A good qualitative agreement is observed between the measured data and full-wave electromagnetic simulations in the sense that multiple plasmonic resonances (dip in transmission) are observed in-between EOT peaks. Two EOT and four plasmonic resonances are identified in the measured spectra. In general, higher order plasmonic modes, i.e. higher frequency resonances, are observed to have larger quality factors. By way of example, the resonance may occur at a frequency of at least 0.5 THz, at least 0.6 THz, at least 0.7 THz, at least 0.8 THz, at least 0.9 THz, or at least 1 THz, such as from 0.5 THz to 10 THz, from 0.5 THz to 5 THz, from 0.5 THz to 3 THz, or from 0.5 THz to 2 THz.

After characterizing the general features of the resonances, transmission was measured through samples with varying properties. The first effect or variable explored was the role of polarization on the transmission through a stripe-patterned film. For this purpose, the response at the two orthogonal polarizations as depicted in FIG. 6A are considered. When the incident THz beam is polarized parallel to the stripes ($E_\parallel$), a monotonically increasing transmission, consistent with a Drude response, is observed. However, when the incident polarization is perpendicular to the stipes($E_\perp$), the response shows a resonant (Lorentzian) response, the origin of which has already been discussed. From the non-resonant transmission, a relaxation time of ~0.5 ps is extracted, which is in close agreement with the results observed from transmission measurements through un-patterned films.

The effect of polarization can be simply understood through reference to analogous circuit models. When the terahertz field is polarized parallel to the direction of the stripes, i.e. $E_{THz}=E_\parallel$, the response of the structure essentially follows a RL circuit and therefore transmission increases with frequency at a rate set by $L_k$ and is thus directly dependent on τ. When the terahertz field is polarized perpendicular to the direction of the stripes, i.e. $E_{THz}=E_\perp$, the response could be represented by a resonant series RLC circuit as described herein. The resonant response of measured resonances was modeled as a damped-Lorentzian oscillator, where the measured transmission response was fitted to equation 2, below.

$$\frac{A}{(\omega - \omega_p)^2 - (\Gamma_{res}/2)^2}.$$

Here $\gamma_{res}$ represents the linewidth of the resonance, and A its magnitude. Lorentzian fits of the data to Eqn. (2) are plotted as the dashed curve in FIG. 6A. The Q-factor of the resonance was extracted, and found to be ~2.45±0.1 at ~0.75 THz. This Q factor is substantially larger than what has been previously reported in graphene and is on the order of Q~$\omega_p$τ. This large Q might also indicate an effectively longer τ for longitudinal, i.e. plasmonic, electromagnetic wave propagation than what is the case under normal incidence transmission. Discrepancies with regard to constitutive parameters affecting normal incidence and longitudinal measurements have been reported in metals. Furthermore, a broadening of the EOT peaks could also be contributing to a further enhancement in Q-factor of adjacent resonant dips. When comparing samples before and after annealing, an increase in Q factor is observed, as well as an increase in extinction, and a blue-shift (increase in frequency) of $\omega_p$ (as depicted in FIG. 6B), which are consistent with a longer $\tau$, a larger $\sigma_0$, and a larger n, respectively. It is to be noted that the charge density, n, governs the position of the resonance, while $\tau$ defines its strength.

The observed Q in the annealed example is even larger, ~3.7±0.2, which is consistent with an increase of ~2× in $\tau$ after annealing as observed through normal incidence measurements through bulk films (see FIG. 2B). This Q-factor is among the highest reported to date in plasmonic structures at this frequency range (e.g., greater than 0.3 THz, greater than 0.4 THz, greater than 0.5 THz, greater than 0.6 THz, greater than 0.7 THz, such as 0.7 to 2 THz, or 0.7 to 1.5 THz). As previously noted, the example shown in FIG. 12B exhibited even higher Q-factor, of ~5.

Finally, the effect of altering the geometric dimensions of the 3D-DSM material was also explored. FIG. 6C shows the effect of altering W and/or L. The two curves presented correspond to transmission through stripe-patterned samples having W=100 µm, L=200 µm and W=70 µm, L=140 µm, respectively. As will be apparent, the aspect ratio (L/W) remained unchanged at 2:1. It was observed that decreasing the geometric dimensions (length and/or width) leads to a blue shift (increased frequency) of the resonance, which is consistent with the qualitative trend predicted by Eqn. (1). That said, due to variability across samples resulting from the deposition process, a particular scaling law has not yet been developed. Overall, the present observations establish the first direct demonstration of terahertz plasmons in a 3D-DSM material, such as $Cd_3As_2$. While demonstrated for $Cd_3As_2$, it will be appreciated that various other 3D-DSM materials may also be suitable for use, e.g., including, but not limited to $SrSi_2$, $Na_3Bi$, $NbAs$, $ZrTe_5$, $MoTe_2$, or $TaAs$, as well as others. Examples of various 3D-DSM materials which may be suitable for use are described in "Electron Transport in Dirac and Wehl Semimetals", Chin. Phys. B Vol. 27, No 10 (2018), herein incorporated by reference in its entirety.

In order to employ 3D-DSMs for terahertz plasmonics, active modulation of carrier density could play an important role. This may be achieved by electrostatic gating of 2D-DSMs, although the present disclosure proposes the possibility of modulating the carrier density by injecting photo-carriers. In this regard, gapless and linear dispersion materials have also been associated with unique photo physics, marking an ultrafast recombination of carriers. Hence, in the present disclosure, time-resolved optical pump measurements are employed to demonstrate an ultrafast carrier modulation in $Cd_3As_2$. The measured response was marked by strong optical absorption and carrier relaxation within ~40 ps, with optical excitation at 800 nm. It will be appreciated that the optical excitation could be at a higher or lower wavelength (e.g., at least 250 nm, at least 300 nm, at least 400 nm, at least 500 nm). Far higher wavelengths may also be suitable, at least for some applications. In an embodiment, the wavelength used for optical excitation may be from 500 nm to 2,000 nm, although such is merely provided as an example.

Figure 7A:
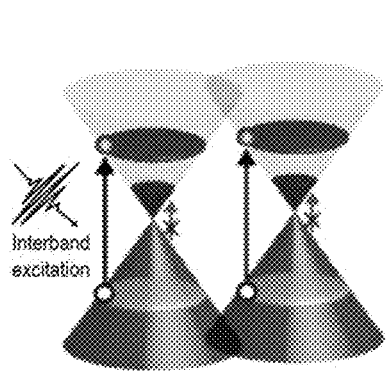
FIG. 7A shows a schematic representation of optical pump excitation of carriers, illustrating the ultrafast carrier density modulation and plasmon tuning in 3D-DSM (e.g., $Cd_3As_2$) geometric films.
Figure 7A:
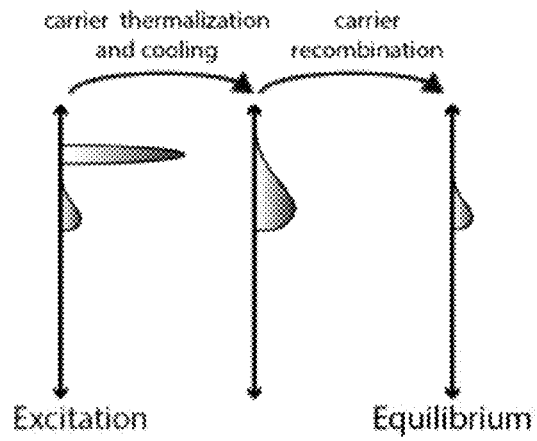
Figure 7B:
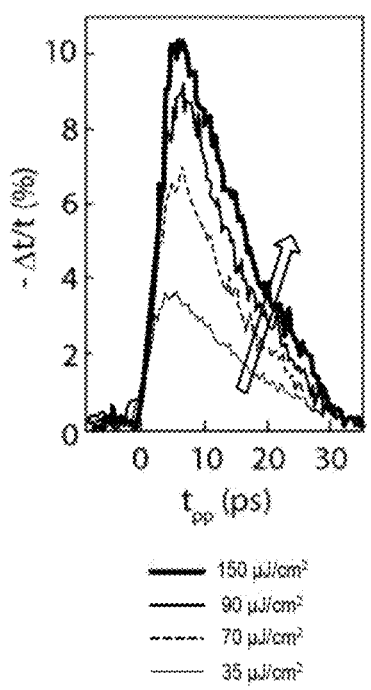
FIG. 7B shows measured ultrafast carrier recombination in $Cd_3As_2$ films at different pump fluences. Ultrafast response (<30 ps) is observed, making these materials and structures attractive for ultrafast terahertz opto-electronic applications. The pump fluence levels shown in FIG. 7B are 35, 70, 90, and 150 µJ/cm$^2$, with the arrow marking the trend with increasing pump fluence.
Figure 7C:
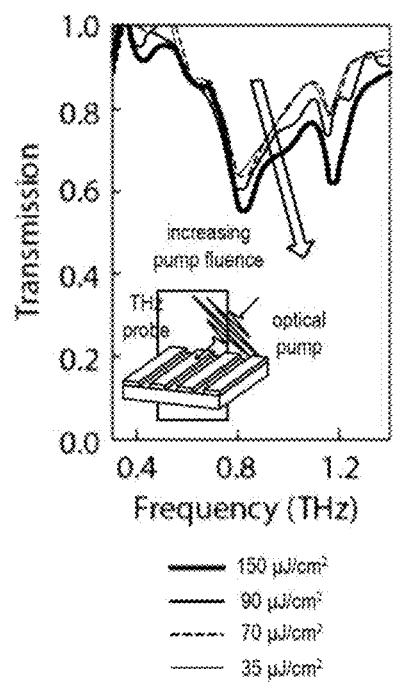
FIG. 7C shows plasmon resonance tuning in a stripe-patterned sample. The arrow marks the trend with increasing pump fluence, blue shift (shorter frequency) of the resonances as well as larger extinction is observed. The pump fluence levels shown in FIG. 7C are 35, 70, 90, and 150 µJ/cm$^2$.

FIGS. 7A and 7AA illustrate the allowed optical transitions in a typical gapless material where only transitions arising from excitations with energy $\geq \varepsilon F$ are allowed. Hence, assuming the $\varepsilon_F$~200 meV in annealed films, 800 nm excitation would excite carriers to energy of ~750 meV above the Dirac point. The measured transmission through un-patterned films shows a strong modulation (FIG. 7B). Using similar pump excitations on stripe-patterned samples demonstrates a noticeable tuning of the plasmon resonance (FIG. 7C), where enhanced extinction and blue-shift of the resonance displays the expected trend with carrier injection, as discussed herein. Optical pump excitation is thus also established as an effective route to ultrafast tunable terahertz plasmon response in 3D-DSM materials, such as $Cd_3As_2$. Given the high doping concentration of the as-grown films, the induced change upon photoexcitation is limited. Higher purity of the material could provide a greater induced change. As noted, the high carrier density occurs where arsenic vacancies impart an unintentional n-type doping to the material. This limitation can by further optimizing the growth conditions.

The exploration and practical application of terahertz plasmons in 2D-DSMs has become an attractive scientific topic following the discovery of graphene. Furthermore, terahertz plasmonics in non-Dirac materials including superconductors and high-mobility semiconductors have also been demonstrated. The present disclosure introduces $Cd_3As_2$ and other 3D-DSM materials to the "library" of materials that may be used for terahertz plasmonics. Observation of Dirac plasmons in graphene on SiC have shown a Q-factor of ~1.2, at a resonance frequency of 1.7 THz. Having fast momentum relaxation times (e.g., from ~0.3 to ~1 ps), the present configurations can display higher quality factors, even in an ultra-thin film form, as the present configurations employed a substrate with a lower dielectric constant (n~2.1 vs. ~3.2). Furthermore, in bulk form, the present configurations exhibit multiple spectrally-narrow resonances originating from high-order as well as hybrid modes.

Figure 8:
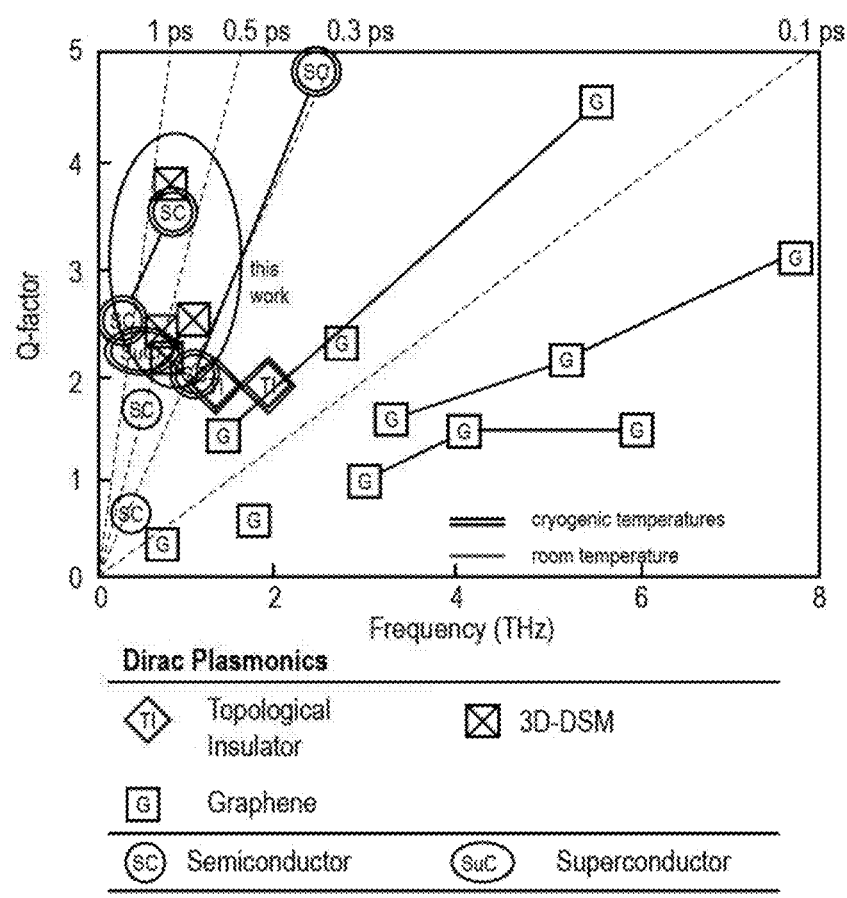
FIG. 8 benchmarks Q-factors of terahertz plasmons with previous literature studies (e.g., semiconductors, superconductors, topological insulators, and semi-metals). As a result of the long $\tau$ in the present tested samples, the resonances observed in the present embodiments are among the narrowest in the 0 to ~1 THz spectral range. Dashed lines correspond to constant $\omega_p \times \tau$ product.

FIG. 8 benchmarks results from the present configurations (using Q-factor as the criterion) against published values of terahertz plasmons in various other materials. FIG. 8 summarizes the Q-factors associated with plasmon resonances observed in Dirac and parabolic band materials, based on published studies. In general, plasmon resonances in graphene and two dimensional electron gases in high mobility semiconductors have been reported to have the highest Q-factors. In comparison, the present configurations demonstrate strong resonances in a 3D-DSM material where geometrically defined resonances transform into spectrally-narrow resonances as a result of the contribution of a large kinetic inductance.

The present configurations achieve a strong terahertz plasmon response in $Cd_3As_2$, a 3D-DSM material. The long momentum scattering time in thermally evaporated polycrystalline films enables spectrally narrow resonances. Furthermore, an ultrafast tunable response is demonstrated through excitation of photo-induced carriers. The present configurations pave a way for the development of myriad terahertz optoelectronic devices based on $Cd_3As_2$ and similar 3D-DSM materials, benefiting from strong coupling of terahertz radiation, ultrafast transient response, magneto-plasmon properties, and the like. Moreover, large kinetic inductance associated with long momentum scattering time, in $Cd_3As_2$ holds enormous potential in the field of RF integrated circuits.

II. Examples

Thin film $Cd_3As_2$ was thermally evaporated from commercial $Cd_3As_2$ lumped source materials (American Elements, product #CD-AS-05-L), where crystalline growth was observed at an optimized substrate temperature. During the deposition the chamber pressure was maintained at $3\times10^{-5}$ Torr and the films were deposited at an average rate of 10.5 A/sec. By way of example, vacuum pressure conditions may be maintained during such deposition (e.g. no more than $1\times10^{-3}$ Torr, no more than $1\times10^{-4}$ Torr, no more than $5\times10^{-5}$ Torr, or no more than $1\times10^{-5}$ Torr). It was found that the substrate temperature should be maintained within a narrow temperature range (e.g., 95-100 C), as lower temperatures did not yield conductive films and at higher temperatures the film did not adhere well to the substrate.

Annealing of the films was performed in a three-zone tube furnace under an inert atmosphere (e.g., Ar gas). The temperature of the first zone (corresponding to the sample placement) was gradually heated (e.g., 4° C./min), to 450° C. The sample was maintained at this temperature for ~2 hours and was slowly cooled down with insert gas (e.g., Ar) flow back to ambient temperature (e.g., 20-25° C.). The cooling rate was about 2° C./min. Annealing may more generally be performed at a temperature of at least about 250° C., at least about 300° C., at least about 350° C., less than about 600° C., such as from 350° to 500° C., or from 400° C. to 500° C. The annealing time at such temperature may be at least about 30 minutes, at least about 60 minutes, no more than about 10 hours, no more than about 5 hours, such as from about 1 hour to about 3 hours.

In order to take the terahertz measurements, ultrafast optical pulses were generated by a 1 KHz amplified Ti-sapphire laser (4 mJ, 85 fs pulses) system, where a majority of the radiation was used for optical excitation of carriers while the remainder was employed for time domain terahertz spectroscopy, THz-TDS measurements. Linear spectroscopy was performed using a conventional THz-TDS setup using optical rectification and electro-optic sampling for generation and detection of terahertz radiation via 1 mm ZnTe crystal. Time-resolved optical-pump terahertz-probe (OPTP) measurements were performed by varying the time delay between the optical pump and THz-probe pulses using a mechanical stage. The frequency dependent terahertz spectrum was obtained at different time delays after excitation by fixing the optical pump at a desired position and sampling the THz probe using a second delay stage.

The inventors have already shown Q factors in the range of 3-5, which are believed to be the highest to date at ambient temperature in any semi-conductor based plasmonic structure in the THz range. Such preliminary results evidence that the 3D nature of $Cd_3As_2$ (and similar materials) may provide a more robust platform for THz plasmonic applications that what is otherwise possible in 2D Dirac materials such as graphene. By further improving the materials quality, results can be demonstrated that are even significantly better (e.g., Q>5, such as 5<Q<10, or even Q values into the hundreds) than those described herein in terms of plasmonic strength, positioning 3D DSM materials such as $Cd_3As_2$ as a very attractive choice for THz plasmonics applications.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. An ultra-compact inductor for use in an integrated circuit, comprising:
   a 3D-DSM material formed into a geometric shape capable of inductance; and
   a substantially non-conductive substrate on which the 3D-DSM material is deposited.

2. The inductor of claim 1, wherein the 3D-DSM material is in the geometric shape of a stripe, a dot, or other closed shape.

3. The inductor of claim 1, wherein the 3D-DSM material is in the geometric shape of a series of patterned stripes, dots, or other features separated from one another by the substantially non-conductive substrate.

4. The inductor of claim 1, wherein the 3D-DSM material comprises at least one semimetal selected from As, B, Si, Ge, Sb, Te, Po, At, or Bi.

5. The inductor of claim 1, wherein the 3D-DSM material comprises As.

6. The inductor of claim 1, wherein the 3D-DSM material comprises $Cd_3As_2$.

7. The inductor of claim 1, wherein the 3D-DSM material comprises at least one of $Cd_3As_2$, $SrSi_2$, $Na_3Bi$, NbAs, $ZrTe_5$, $MoTe_2$, or TaAs.

8. An ultra-compact inductor for use in an integrated circuit, comprising:
   a 3D-DSM material formed into a geometric closed shape capable of inductance; and
   a substantially non-conductive substrate on which the 3D-DSM material is deposited.

9. A method for manufacturing an ultra-compact inductor as part of an integrated circuit, the method comprising:
   providing a substantially non-conductive integrated circuit substrate;
   applying a polymer layer adjacent the substrate;
   patterning the polymer layer, to result in a portion of the underlying substrate being exposed;
   applying a 3D-DSM material over the patterned polymer layer and the substrate, the 3D-DSM material being deposited onto the substrate into locations so as to cover the previously exposed substrate;
   removing the polymer layer and any 3D-DSM material applied thereover, from the substrate, so as to leave a closed geometric shape of the 3D-DSM material deposited on the substantially non-conductive substrate material, wherein the geometric shape of the 3D-DSM material is capable of inductance.

10. The method of claim 9:
    wherein patterning the polymer layer results in the polymer layer including a first polymer portion and a second polymer portion that are separated from one another by the substrate therebetween;
    wherein applying the 3D-DSM material over the patterned polymer layer and the substrate results in the 3D-DSM material being deposited onto the substrate into locations between the first and second polymer portions;
    wherein removing the polymer layer comprises removing the first and second polymer portions and any 3D-DSM material applied thereover, from the substrate, so that the closed geometric shape of the 3D-DSM material comprises a first closed geometric shape portion and a second closed geometric shape portion, which shape portions are separated from one another by the substantially non-conductive substrate material, wherein each geometric shape portion of the 3D-DSM material is capable of inductance.

11. The method of claim 9, wherein the 3D-DSM material comprises $Cd_3As_2$.

12. The method of claim 9, wherein the 3D-DSM material is applied over the patterned polymer layer at a temperature of less than about 110° C.

13. The method of claim 9, wherein the 3D-DSM material is applied over the patterned polymer layer at a temperature of at least about 95° C.

14. The method of claim 9, wherein the 3D-DSM material is applied over the patterned polymer layer at a temperature in a range of 95° C. to 100° C.

15. The method of claim 9, further comprising annealing the 3D-DSM material on the substrate.

16. The method of claim 15, wherein an annealing temperature is less than about 600° C.

17. The method of claim 15, wherein an annealing temperature of at least about 350° C.

18. The method of claim 15, wherein an annealing temperature in a range of 350° C. to 500° C.

19. The method of claim 9, wherein the 3D-DSM material comprises a semimetal.

20. The method of claim 9, wherein the 3D-DSM material comprises at least one of $Cd_3As_2$, $SrSi_2$, $Na_3Bi$, NbAs, $ZrTe_5$, $MoTe_2$, or TaAs.

* * * * *